(12) United States Patent
Inoue

(10) Patent No.: US 9,116,425 B2
(45) Date of Patent: Aug. 25, 2015

(54) MOLD FOR NANOIMPRINT LITHOGRAPHY AND METHOD FOR FORMING THE SAME

(75) Inventor: Naoko Inoue, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 279 days.

(21) Appl. No.: 13/480,578

(22) Filed: May 25, 2012

(65) Prior Publication Data

US 2012/0308680 A1  Dec. 6, 2012

(30) Foreign Application Priority Data

Jun. 3, 2011  (JP) ................................. 2011-125513

(51) Int. Cl.
*B29C 59/02* (2006.01)
*G03F 7/00* (2006.01)
*B82Y 10/00* (2011.01)
*B82Y 40/00* (2011.01)

(52) U.S. Cl.
CPC .............. *G03F 7/0002* (2013.01); *B82Y 10/00* (2013.01); *B82Y 40/00* (2013.01); *Y10T 156/1039* (2015.01)

(58) Field of Classification Search
CPC ..................... B29C 2043/3665; B29C 33/306; B82Y 10/00; B82Y 40/00; G03F 7/0002; Y10T 156/1039

USPC .......................................... 425/385; 977/887
See application file for complete search history.

(56) References Cited

U.S. PATENT DOCUMENTS

2007/0248892 A1   10/2007   Rangelow
2012/0003348 A1*  1/2012   Tsuji et al. .................... 425/470

FOREIGN PATENT DOCUMENTS

| JP | 2005-349619 | 12/2005 |
|---|---|---|
| JP | 2007-145684 | 9/2007 |
| JP | 2008-512274 | 4/2008 |
| JP | 2011-009359 | 1/2011 |
| JP | 2011-061029 | 3/2011 |
| WO | 2006-026993 | 3/2006 |

OTHER PUBLICATIONS

Machine Translation of JP2009-241330.*

* cited by examiner

*Primary Examiner* — Alison Hindenlang
*Assistant Examiner* — Robert J Grun
(74) *Attorney, Agent, or Firm* — Smith, Gambrell & Russell LLP.

(57) ABSTRACT

A mold for the nanoimprint lithography and a method for forming the mold are disclosed. The mold comprises a base socket, a plug chip and an adhesive. The plug chip provides a fine pattern to be transcribed in a top surface thereof. The base socket provides a pocket within which the plug chip is set such that the top surface thereof is pushed out from the top surface of the base socket.

10 Claims, 7 Drawing Sheets

MOLD FOR NANOIMPRINT LITHOGRAPHY AND METHOD FOR FORMING THE SAME

BACKGROUND OF THE INVENTION

1. Field of the Invention

The present invention relates to a mold for the nanoimprint lithography and a method for forming the mold.

2. Related Background Arts

A Japanese Patent Application published as JP-2007-245684A has disclosed a method of forming a replica mold used as a stamper of the nanoimprint technique. The method disclosed therein first prepares a master mold with fine patterns on a silicon substrate and a starting material for the mold with a stack of an optically curable resin on an elastic body. Then, stamping the master mold against the optically curable resin, the fine patterns on the master mold may be transcribed on the optically curable resin. Subsequently, leaving the optically curable resin in a room temperature, or in relatively low temperature, as the master mold is stamped thereon, to harden the optically curable resin. Finally, the fine patterns of the master mold may be reflected as the mother mold by the optically curable resin on the elastic body by detaching the master mold therefrom. Then, applying a thermo-curable resin on the master pattern to transcribe the master pattern on the thermo-curable resin, and placing a metal plate on the thermo-curable resin and performing the thermal treatment to harden the thermo-curable resin, the replica mold may be finally obtained by the thermo-curable resin by detaching the metal plate from the mother mold.

The replica mold in the fine patterns thereof thus formed is primarily made of thermo-curable resin. Accordingly, when damages such as scratch, dust, contamination, and so on are caused in the replica mold by the iterated use thereof, no method and means have been known to recover or repair the replica mold. Moreover, the process to obtain the replica mold described therein first forms the mother pattern by the optically curable resin from the master mold, then the replica mold by the thermo-curable resin may be formed from the mother pattern, namely, two-step process to obtain the final replica mold.

SUMMARY OF THE INVENTION

One aspect of the present application relates to an arrangement of a mold for the nanoimprint lithography. The mold comprises a base socket, a plug chip, and an adhesive. The base socket, which has a substantially rectangular plain shape, provides a pocket in a center of a top surface thereof. The plug chip, which also has a rectangular plain shape, has a top surface where a fine pattern to be transcribed is formed and a back surface, and is set within the pocket of the base socket. The adhesive put between the back surface of the plug chip and a bottom of the pocket glues the plug chip to the base socket such that the top surface of the plug chip is pushed out from the top surface of the base socket.

The mold according to an embodiment of the invention may be built with the plug chip having the fine pattern to be transcribed and the base socket to support the plug chip. Accordingly, even when the fine pattern on the plug chip is damaged, degraded by contaminant, and so on by the iterated use, the mold may be recovered or refreshed by replacing only the plug chip.

When the plug chip and the base socket are made of material transparent for ultraviolet rays, the nanoimprint lithography using the ultraviolet rays to harden the imprinted resin by irradiating the imprinted resin with the ultraviolet rays through the base socket and the plug chip. Because the adhesive to glue the plug chip with the base socket is applied only in a periphery of the plug chip and the bottom of the pocket, the adhesive never interferes with the ultraviolet rays.

In an embodiment, the pocket of the base socket provides a groove in the periphery thereof, and the adhesive is applied only within the groove. The center area of the plug chip may be firmly in contact with the center area of the bottom of the pocket, which secures the ultraviolet rays to pass the base socket and the plug chip.

Another aspect of the present application relates to a method to form a mold for the nanoimprint lithography. The method includes steps of, concurrently preparing the base socket and the plug chip, and gluing the plug chip to the base socket. The step to prepare the base socket includes steps of: forming an array of pockets in a base material; and cutting the base material longitudinally and laterally to form the base socket that includes one of the pockets in a center portion thereof. The step to prepare the plug chip includes steps of: forming an array of fine patterns to be transcribed in another base material, and cutting the other base material longitudinally and laterally to form the plug chip that includes one of the fine patterns in a center portion thereof. The step of gluing the plug chip to the base socket includes steps of: applying an adhesive in a periphery of the bottom of the pocket, setting the plug chip within the pocket, and gluing the plug chip to the base socket such that the top surface of the plug chip where the fine pattern is formed is pushed out from the top surface of the base socket where the pocket is formed.

BRIEF DESCRIPTION OF THE DRAWINGS

The invention will be described in further detail with reference to the attached drawings in which:

FIG. 3A is a side cross section of the base socket shown in FIG. 1, while.

FIG. 5A is a side cross section of a mold for the nanoimprint lithography according to the second embodiment of the invention, while.

FIG. 6A is a side cross section of the base socket of the second embodiment, while, FIG. 7A is a side cross section of the plug chip of the second embodiment, while.

DESCRIPTION OF PREFERRED EMBODIMENTS

Next, some preferred embodiments according to the present invention will be described as referring to drawings. In the description of the drawings, the numerals or symbols same with or similar to each other will refer to the elements same with or similar to each other without overlapping explanations.

First Embodiment

Figure 1A:
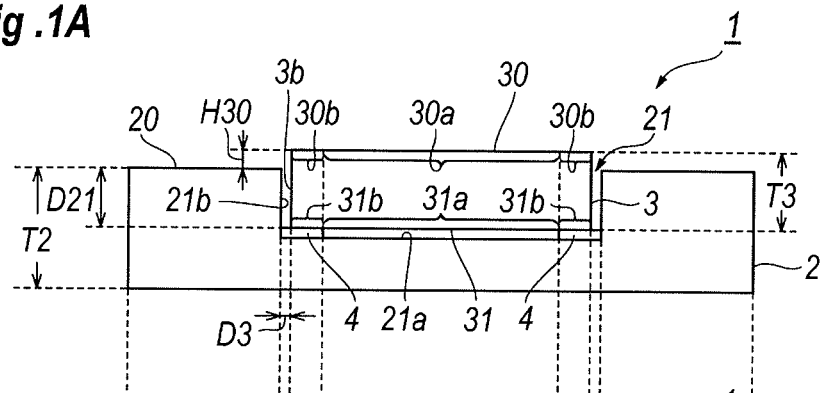
FIG. 1A is a side cross section of a mold for the nanoimprint.
Figure 1B:
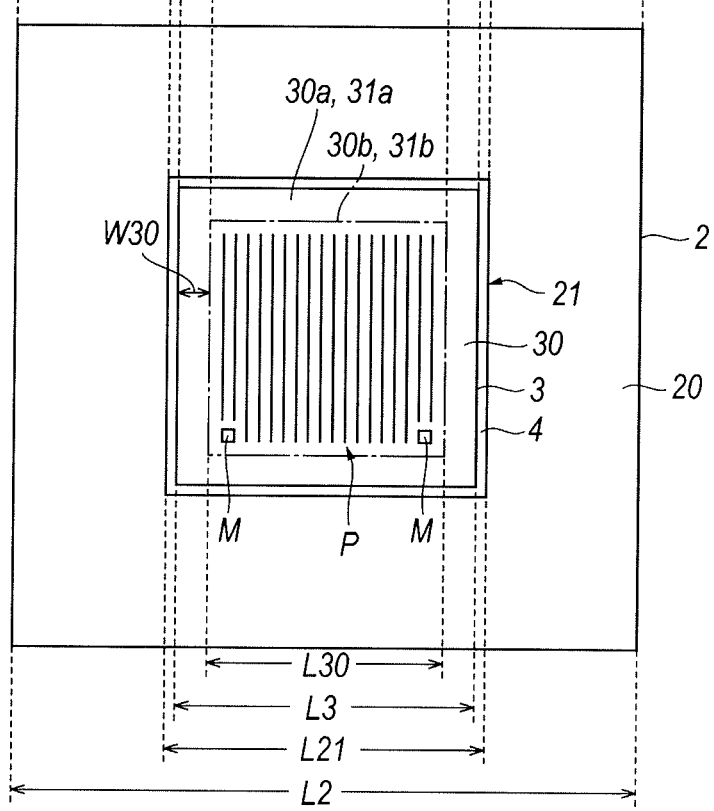
FIG. 1B is a plane view of the mold according to the first embodiment of the invention.
Figure 2A:
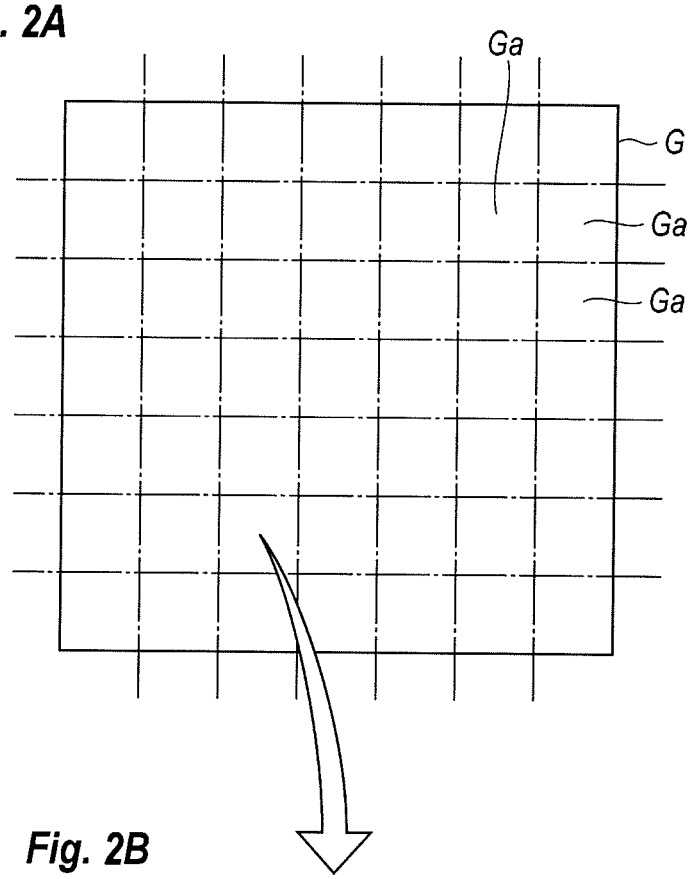
FIGS. 2A and 2B show processes to form the mold shown in FIG. 1.
Figure 2B:
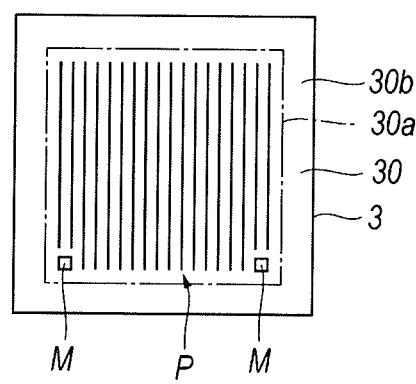

FIG. 1A shows a side cross section of a mold for the nanoimprint lithography according to the first embodiment of the invention, and FIG. 1B is a plan view thereof. The mold 1 includes a base socket 2, a plug chip 3, and an adhesive 4. This mold 1 may be applicable to, what is called, the step-and-repeat nanoimprint lithography.

The base socket 2, which may be made of, for instance, silica glass transparent for ultraviolet rays, substantially has a square shape. Specifically, the base socket 2 has a size of a quarter of the 6025 glass plate with one side L2 of about 65 mm and a thickness T2 of about 6 mm. The base socket 2 has a top surface 20 with a pocket 21 in a center thereof. The pocket 21 also has a square shape with a side L21 of 5-30 mm, which is optional according to one shot size for the nanoimprint lithography. The pocket 21 has a depth D21 of 0.3 to 1.0 mm and a substantially flat bottom.

The plug chip 3, which is set within the pocket 21, may be also made of silica glass transparent to ultraviolet rays and have a square shape with a side L3 of 5-30 mm substantially equal to, or slightly shorter by about 1 mm, preferably 500 μm, than the side L21 of the pocket 21. Thus, the plug chip 3 in a side 3b thereof makes a gap D3 against a side 21b of the pocket 21 shorter than 1 mm. The plug chip 3 may have a thickness T3 thereof about 1 mm.

The plug chip 3 provides a top surface 30 and a back surface 31 opposite to the top surface 30. The top surface 30 in the horizontal level thereof is pushed out from the top 20 of the base socket 2 by a length H30 of about 1-3 μm. The top surface 30 includes a center area 30a and a peripheral area 30b. The center area 30a is substantially square with a side L30 of about 5 mm. The periphery 30b has a rectangular ring shape with a constant width W30 of about 1 mm to surround the center area 30a therein. The first area 30a continues to the second area 30b with no gap therebetween. A feature of the plug chip 3 is that the only center area 30a provides a fine pattern P to be imprinted and two marks M for aligning the plug chip 3.

The back surface 31 includes a center area 31a and a periphery 31b. The latter area 31a faces the periphery 30b in the top surface 30 and has a shape substantially equal thereto. While, the center area 31a faces the center area 30a of the top surface 30 with a shape substantially equal thereto. The back surface 31 is also substantially flat with a slight gap against the bottom 21a of the pocket 21.

The adhesive 4 put between the periphery 31b in the back surface 31 of the plug chip 3 and the bottom 21a of the pocket 21 to glue the plug chip 3 to the base socket 2. Specifically, the adhesive 4 is applied in the bottom 21a of the pocket 21 along the periphery 31b in the back surface 31 of the plug chip 3. On the other hand, the center area 31a in the back surface 31 of the plug chip 3 is completely free from the adhesive 4. The adhesive may include ultraviolet curable resin involving a spacer, which may be filler materials made of powdered silica, or glass fiber, with an even diameter. The dimensions of the filler (diameter) may optionally depend on how the plug chip 3 in the top level thereof is pushed out from the top surface 20 of the base socket 2. For instance, the diameter of the spacer may be 1 to 10 μm.

Next, a method to prepare the mold 1 shown in FIG. 1 will be described. First, the process prepares a substrate G with a size of 2 to 8 inches. The substrate G includes a plurality of sub-areas Ga each for the plug chip 3 and arranged in an array extending longitudinally and laterally. Each of the sub-areas Ga provides in the top surface thereof the center area 30a and the peripheral 30b. The process subsequently forms a pattern P on the center area 30a of respective sub-areas Ga by, for instance, the electron beam (EB) exposure or by using the stepper. Then, each of the sub-areas Ga is separated to each other as shown in FIG. 28. Thus, a plurality of the plug chip 3 may be obtained at the same time.

Figure 3A:
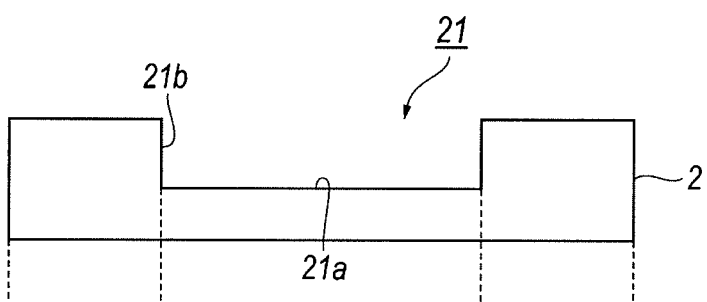
Figure 3B:
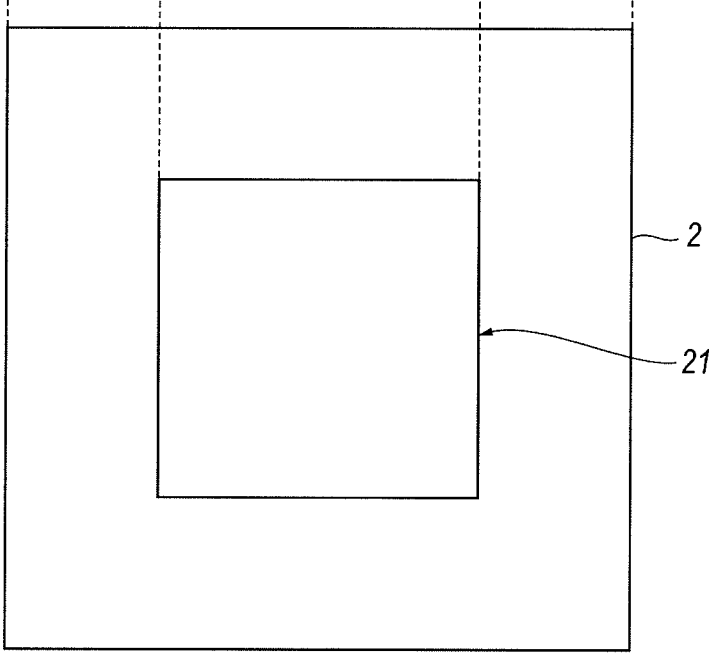
FIG. 3B is a plane view thereof.
Figure 4A:
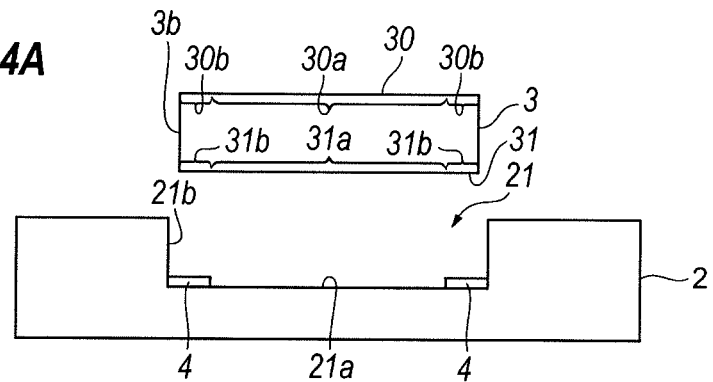
FIGS. 4A to 4C show processes to form the mold shown in FIG. 1.

The process also prepares a base socket 2 shown in FIG. 3 concurrently with, and independent of, the process to form the plug chip 3 described above. The pocket 21 may be formed by well-known techniques, such as wet-etching or dry-etching, after cutting the 6025 glass plate into a quarter thereof. Then, the adhesive 4 is applied with a width of about 1 mm in a periphery of the bottom 21a of the pocket 21 so as to face the periphery 31b in the back surface 31 of the plug chip 3, as shown in FIG. 4A. In this process, a diameter of the filler contained in the adhesive 4 may be set such that the length H30 from the top of the plug chip 3 to the top 20 of the base socket 2 becomes 1 to 3 μm at the completion of the process. In other words, the dimension of the spacer contained in the adhesive 4 may be set to be (D21−T3+1~3) μm, where D21 is the depth of the pocket 21 and T3 is the thickness of the plug chip 3.

Figure 4B:
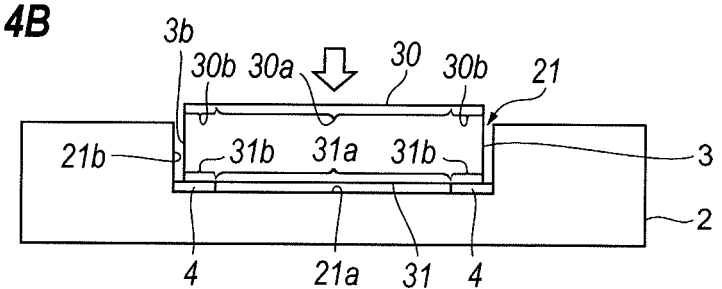
Figure 4C:
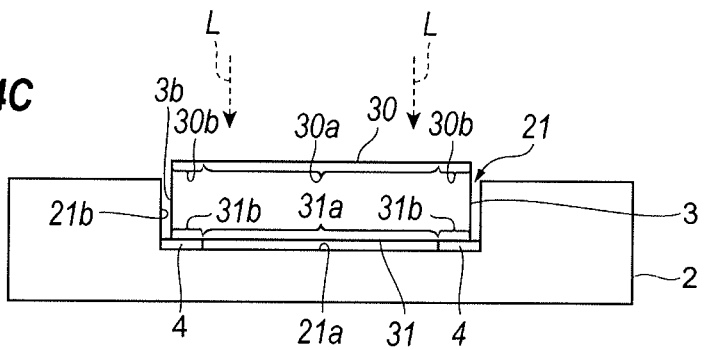

Then, the process pushes the plug chip 3 set within the pocket 21 of the base socket 2 against the bottom 21a thereof by a pressure of 2 to 20N, shown in FIG. 4B, and irradiates the plug chip 3 with the ultraviolet rays to cure the adhesive 4. The adhesive 4 is irradiated by the ultraviolet rays L through the plug chip 3, which is transparent for the ultraviolet rays. Thus, the plug chip 3 is glued into the base socket 2 to complete the mold 1 for the nanoimprint.

The nanoimprint using the mold 1 may be carried out as follows. That is, an epoxy resin curable by the ultraviolet rays is first applied on a substrate as a resist for the nanoimprint. Then, the top surface 30 of the plug chip 3 is pressed against the epoxy resin with a pressure of 4N for 20 seconds. The substrate may be made of semiconductor, such as silicon (Si), InP, GaAs, and so on; metal, ceramics, and/or plastics.

Then, the resin may be cured, as being pressed by the plug chip 3, by the ultraviolet rays irradiated through the base socket 2 and the plug chip to harden the ultraviolet curable resin. The exposure dose and the period of the ultraviolet rays may be, for instance, 350 mJ/cm$^2$ and 80 seconds, respectively. Thus, the pattern formed on the top surface 30 of the pattern body may be imprinted on the resin.

As described above, the plug chip 3 is repeatedly in contact with the resin, which possibly degrades the pattern on the plug chip 3 or at least makes the plug chip dirty. Accordingly, the plug chip 3 is necessary to be replaced, or recovered by the following procedures. That is, the resin adhered on the top surface 30 of the plug chip 3, or slipped into the gap between the sides, 21b and 3b, in the pocket 21 may be removed by ashing using oxygen for about 60 minutes accompanied with subsequent wet-treatment for 30 minutes by a chemical solution of sulfuric acid with hydrogen peroxide.

Then, the plug chip 3 may be detached from the base socket 2 by soaking them within acetone and/or water for about 30 minutes, which swells the adhesive. When foreign matters are found on the surface of the base socket 2 by inspecting through the stereoscopic microscope, a cleaning process of the ashing accompanied with subsequent wet-treatment aforementioned may be carried out. Finally, a new plug chip 3 is set within the pocket 21 of the base socket 2 to recover the mold 1 for the nanoimprint.

The mold 1 according to an embodiment provides the base socket 2 and the plug chip 3 in respective bodies. Moreover, the fine pattern P to be imprinted is formed only in the plug chip 3. Accordingly, even when the pattern P is degraded or deformed, only the plug chip 3 may be replaced to recover the mold 1 for the nanoimprint.

Moreover, the plug chip 3 of the embodiment provides the center area 30a where the pattern P is formed and the periphery 30b free from the pattern P. The adhesive to glue the plug chip 3 with the base socket 2 is applied only in the periphery 31b that, in the back surface 31 of the plug chip 3, corresponds to the periphery 30b in the top surface 30 thereof. That is, the adhesive is not applied on an area between the center area 31a of the back surface 31 corresponding to the center area 30a providing the center area 30a of the top surface 30. Accordingly, the ultraviolet rays to cure the resin for the nanoimprint is not affected from, or disturbed by the adhesive 4.

Still further, because the resin 4 contains the spacer, the height H30 from the top of the plug chip 3 to the top surface of the base socket 2 may be optionally adjusted by varying the dimensions of the spacer, which may stable the pressure against the resin for the nanoimprint to transcribe the fine pattern precisely and exactly.

The plug chip 3 of the embodiment may be made of silica glass, which may facilitate the detachment of the plug chip 3 from the resin to be transcribed after irradiating the resin with the ultraviolet rays, which ensures the imprinted pattern on the resin. Moreover, in the embodiment thus described, the shot size of the imprinted pattern on the resin may be determined by the size of the plug chip 3, or that of the base socket 2, which enables that the nanoimprint process using the plug chip 3 utilizes the whole of the substrate without leaving any residual spaces on the substrate.

Second Embodiment

Figure 5A:
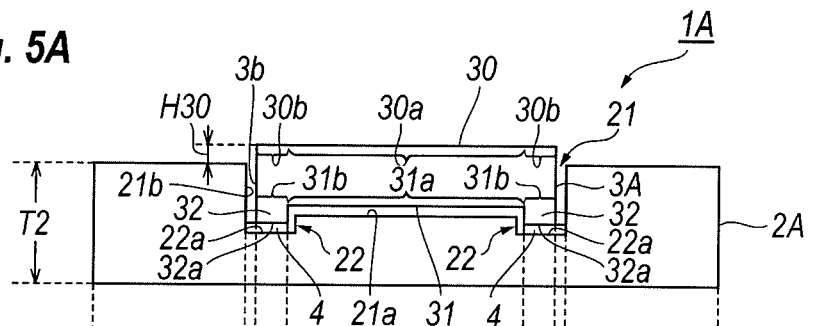
Figure 5B:
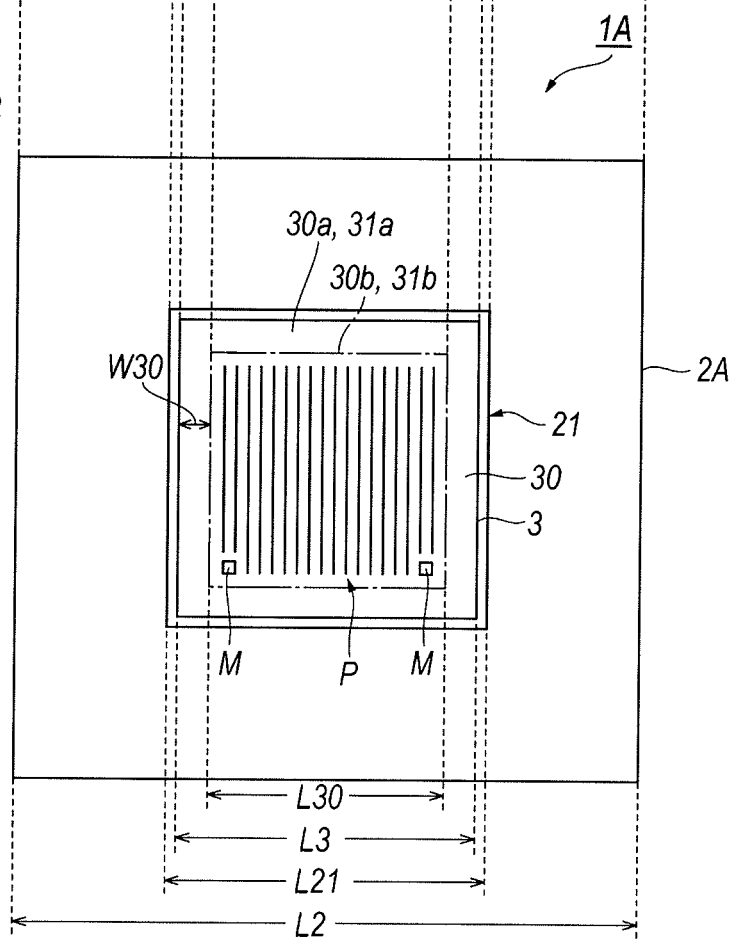
FIG. 5B is a plane view thereof.

FIGS. 5A and 5B shows another mold 1A according to the second embodiment of the present invention, where FIG. 5A shows a side cross section, while, FIG. 5B shows a plan view thereof. The mold 1A includes a base socket 2A, a plug chip 3A, and an adhesive 4 which is same as that of the aforementioned embodiment. This mold 1A may be also applicable to, what is called, the step-and-repeat nanoimprint lithography.

Figure 6A:
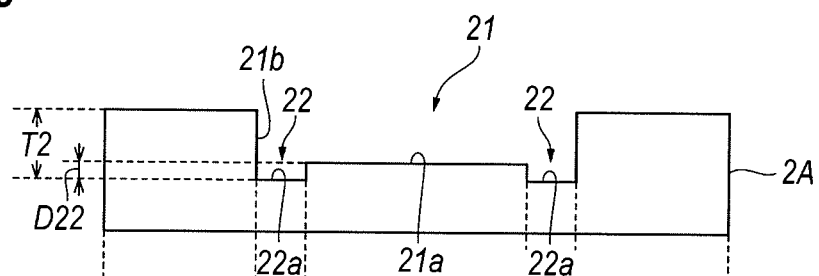
Figure 6B:
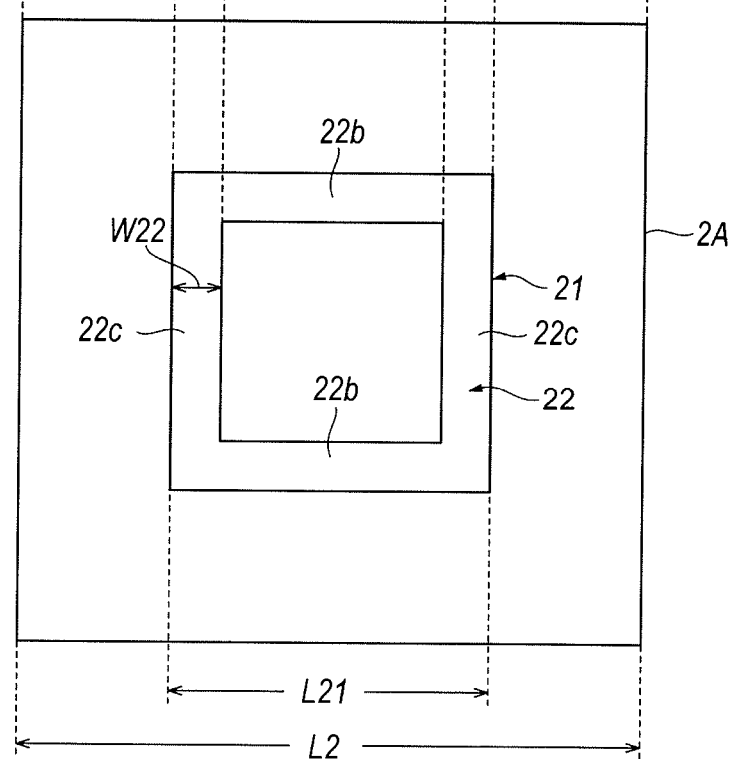
FIG. 6B is a plane view thereof.

FIG. 6A schematically shows a side cross section of the base socket 2A, while, FIG. 6B shows a plan view thereof. As shown in FIGS. 5A to 6B, the base socket 2A of the present embodiment has features distinguishable from those of the aforementioned embodiment in a point that the base socket 2A has a groove 22 in a periphery of the bottom 21a of the pocket 21. The groove 22 includes two longitudinal grooves 22c and two lateral grooves 22b each having a substantially flat bottom 22a and connecting the ends of the former grooves 22c, A width and a depth of respective grooves, 22b and 22c, are substantially the same. That is, the groove 22 is formed in the periphery of the pocket 21 with a constant width and depth to face the periphery 31b of the plug chip 3A, The width W22 of the groove 22 may be, for instance, about 2 mm, while, the depth D22 thereof may be, for instance, about 500 µm. On the other hand, the depth of the pocket 21 may be about 1 mm.

Figure 7A:
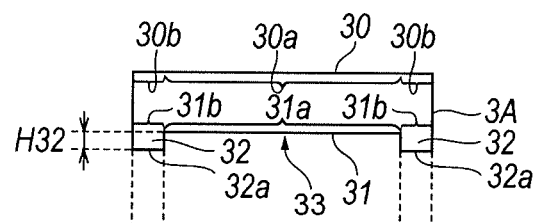
Figure 7B:
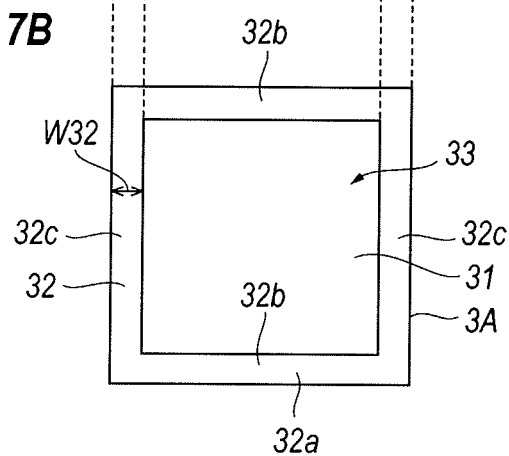
FIG. 7B is a plane view thereof.

FIG. 7A shows a side cross section of the plug chip 3A, while, FIG. 7B is a plan view of the back surface thereof. As shown in FIGS. 7A and 7B, the plug chip 3A has a feature distinguishable from the aforementioned plug chip 3 in a point that the plug chip 3A of the present embodiment has a bank 32 in the periphery 31b of the back surface 31 thereof. Paradoxically, the plug chip 3A of the present embodiment provides a pocket 33 in the center 31a thereof surrounded by the bank 32. The bank 32 includes two longitudinal banks 32b and two lateral banks 32c connecting the end of the former banks 32b. These banks, 32b and 32c, have substantially an even height H32 of about 500 µm and an even width W32 of about 1 mm slightly smaller than the width W22 of the groove 22 in the base socket 2A.

The adhesive 4 in the present embodiment, as shown in FIG. 5A, is applied only in the bottom 22a of the groove 22. Because the bank 32 of the plug chip 3A is fit within the groove 22 of the base socket 2A, the adhesive is put between the bottom 22a of the groove 22 and the top 32a of the bank 32.

The mold 1A of the present embodiment may be formed in a same manner with those of the aforementioned process. However, the plug chip 3A is necessary to be scooped in the pocket 33 to form the bank 32. Also, the mold 1A, same with the mold 1 of the first embodiment, may replace or recover the plug chip 3A when it is degraded or deformed.

The mold 1A for the nanoimprint may securely prevent the adhesive from invading into the center area 30a of the plug chip 3A where the fine pattern P are prepared even when a gap between the back surface 31 of the plug chip 3A, and the bottom 21a of the pocket disappears because the adhesive 4 is put within the groove 22 of the base socket 2A. The adhesive 4 never interferes with the ultraviolet rays from passing through the plug chip 3A.

The plug chip 3A in the center area 31a thereof may be in contact with the center area 21a of the pocket 21, which facilitates the alignment of the plug chip 3A with the base socket 2A. Moreover, the bank 32 of the plug chip 3A is set within the groove 22 of the base socket 2A, which may escape the plug chip 3A from displacement; in particular, the rotational displacement of the plug chip 3A may be securely prevented.

Although the present invention has been fully described in conjunction with the preferred embodiment thereof with reference to the accompanying drawings, it is to be understood that various changes and modifications may be apparent to those skilled in the art. For instance, the resin 4 is unnecessary to be applied in a ringed or closed loop shape in a whole of the periphery of the bottom 21a, or a whole of the bottom 22a of the groove 22. The adhesive 4 may be applied in points to make the protruding height H30 of the top of the plug chip, 3 or 3A, from the top surface of the base socket, 2 or 2A, in even taking the bond strength of adhesive into account. Moreover, the embodiments above described concentrate of the nanoimprint process using the ultraviolet rays to harden a resist/resin applied on a substrate. However, the mold providing the base socket and the plug chip may be applicable to another nanoimprint lithography that lowers a process temperature to harden the imprinted resin. In such a mold for the other nanoimprint process, the adhesive may be applied in the whole of the back surface of the plug chip. Such changes and modifications are to be understood as included within the scope of the present invention as defined by the appended claims, unless they depart therefrom.

The invention claimed is:

1. A mold for nanoimprint lithography, the mold comprising:
    a base socket having a top surface and a pocket, the pocket having a bottom with a periphery;
    a plug chip set within the pocket of the base socket, the plug chip having a top surface with a center area, a back surface opposite to the plug chip top surface and having a center area and a periphery surrounding the center area, and a pattern for the nanoimprint in the plug chip top surface center area, the plug chip back surface center area corresponding to the plug chip top surface center area; and
    an adhesive to glue the plug chip with the base socket,
    wherein the top surface of the plug chip is pushed out from the top surface of the base socket, and
    wherein the adhesive is applied only between the back surface periphery of the plug chip and the periphery of the bottom of the pocket, the back surface of the plug chip center area being free from the adhesive.

2. The mold of claim 1,
wherein the adhesive contains a spacer material to form a gap between the bottom of the pocket and the center area of the back surface of the plug chip.

3. The mold of claim 1,
wherein the top surface of the plug chip is pushed out from a top surface of the base socket by at least 500 μm.

4. The mold of claim 1,
wherein the bottom of the base socket provides a groove in the periphery thereof, and
wherein the adhesive is applied within the groove.

5. The mold of claim 4,
wherein the plug chip back surface provides a bank in the periphery thereof, the bank being set within the groove in the pocket of the base socket.

6. The mold of claim 4,
wherein the plug chip back surface center area is firmly in contact with a center area of the bottom of the pocket.

7. The mold of claim 1,
wherein the plug chip back surface provides a bank in the periphery thereof, the bank forming a gap between the center area of the plug chip back surface and a center area in the pocket of the base socket.

8. The mold of claim 1,
wherein the base socket and the plug chip are made of material transparent to ultraviolet rays.

9. A mold for nanoimprint lithography, the mold comprising:
a base socket having a top surface and a pocket, the pocket having a bottom with a periphery;
a plug chip set within the pocket of the base socket, the plug chip having a top surface with a center area, and a pattern for the nanoimprint in the plug chip top surface center area; and
an adhesive to glue the plug chip with the base socket,
wherein the top surface of the plug chip is pushed out from the top surface of the base socket, and
wherein the base socket pocket has a groove in the periphery of the bottom thereof, and
wherein the adhesive is applied within the groove.

10. A mold for nanoimprint lithography, the mold comprising:
a base socket having a top surface and a pocket, the pocket having a bottom with a center area therein;
a plug chip set within the pocket of the base socket, the plug chip having a top surface, a back surface with a center area and a periphery, and a pattern for the nanoimprint in the plug chip top surface center area; and
an adhesive to glue the plug chip with the base socket,
wherein the top surface of the plug chip is pushed out from the top surface of the base socket, and
wherein the plug chip back surface provides a bank in the periphery thereof, the bank forming a gap between the center area of plug chip back surface and the center area of the base socket pocket.

* * * * *